United States Patent
Chidambaram

(10) Patent No.: US 7,019,549 B2
(45) Date of Patent: Mar. 28, 2006

(54) APPARATUS AND METHOD FOR ELECTRICAL CONTACT TESTING OF SUBSTRATES

(75) Inventor: Mahendran Thirayium Chidambaram, Fremont, CA (US)

(73) Assignee: Intersection Technologies Corporation, Saratoga, CA (US)

(*) Notice: Subject to any disclaimer, the term of this patent is extended or adjusted under 35 U.S.C. 154(b) by 0 days.

(21) Appl. No.: 10/829,765

(22) Filed: Apr. 23, 2004

(65) Prior Publication Data
US 2005/0237081 A1   Oct. 27, 2005

(51) Int. Cl.
*G01R 31/00* (2006.01)

(52) U.S. Cl. .................................... 324/770

(58) Field of Classification Search ............... 324/770, 324/158.1, 528, 750, 755, 756, 758, 761, 324/763, 764, 765

See application file for complete search history.

(56) References Cited

U.S. PATENT DOCUMENTS 6,809,544 B1 * 10/2004 Liao et al. ................ 324/770

* cited by examiner

*Primary Examiner*—Nestor Ramirez
*Assistant Examiner*—Trung Q. Nguyen
(74) *Attorney, Agent, or Firm*—Fenwick & West LLP

(57) ABSTRACT

The invention includes a method and apparatus for electrical contact testing of LCD panels. In this invention the said system apparatus consists of a frame, x,y,z translation devices, a vision unit, a rotary direct drive mechanism for positioning, an integrated tester, LCD holding device, and a probe card. Electrical contact testing is achieved via:

- A LCD panel to be electrically tested is placed on the chuck and held down with vacuum.
- The x-y translation device then aligns the fixed substrate with the test head and probe card via a vision unit.
- The rotary mechanism corrects for any angular errors for accurate probe contact.
- Once aligned the probe device makes contact with the bond pads located on the panel.
- Electrical test signals are then sent from the integrated tester via probe card pins to measure storage capacitance to determine defects present in the panel.

18 Claims, 4 Drawing Sheets

TEST SYSTEM BLOCK DIAGRAM

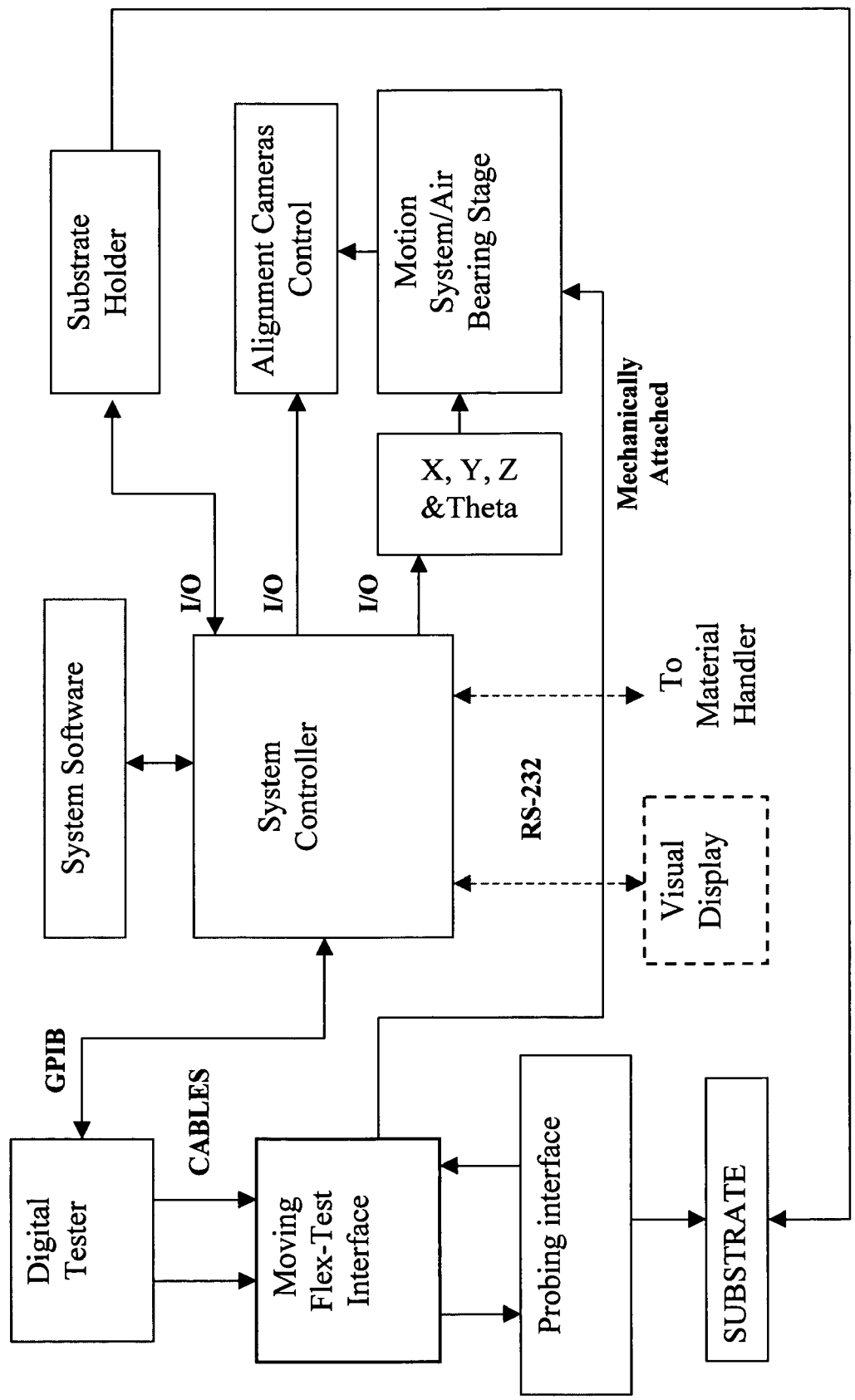
FIGURE 1: TEST SYSTEM BLOCK DIAGRAM

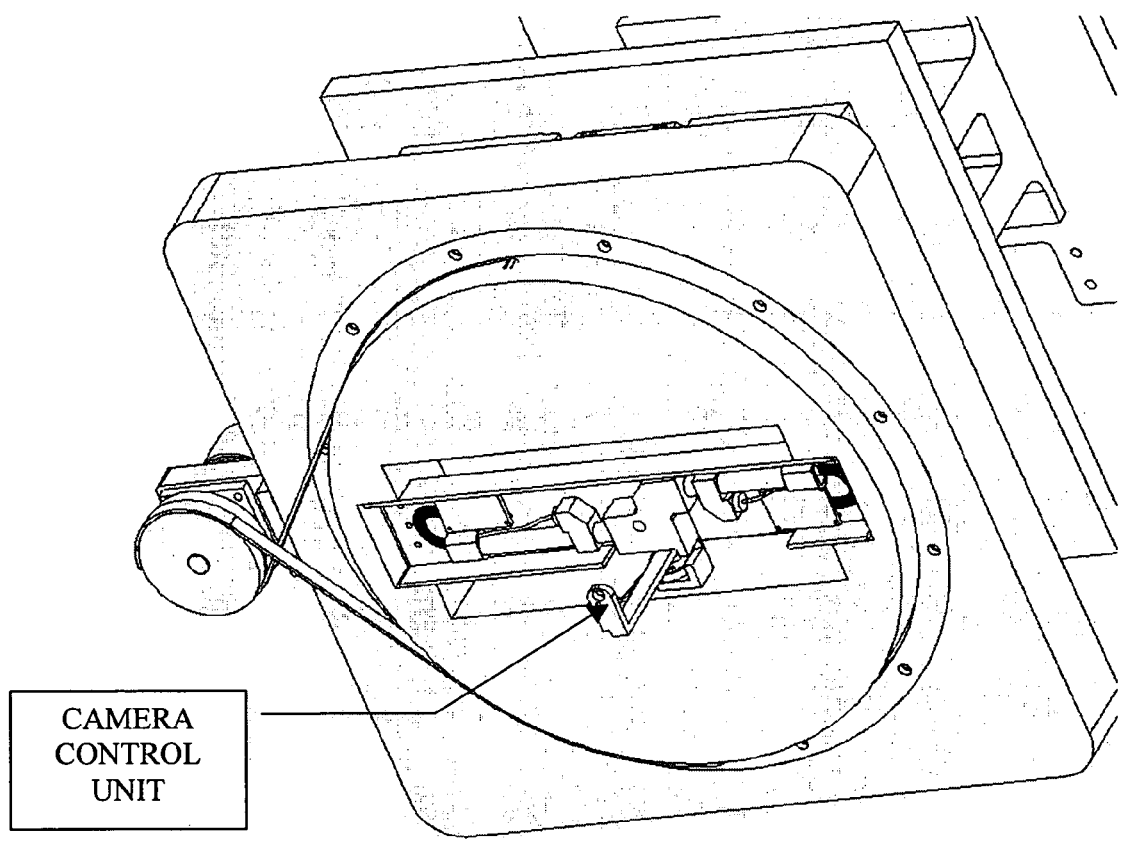
FIGURE 2B: TEST SYSTEM ALIGNMENT CAMERA

APPARATUS AND METHOD FOR ELECTRICAL CONTACT TESTING OF SUBSTRATES

RELATED PATENT APPLICATION

This application claims priority from U.S. provisional patent 60/464,209, with a filing date of Apr. 22, 2003 entitled "Apparatus and method for electrical contact testing of substrates".

BACKGROUND OF THE INVENTION

Field of the Invention

The present invention relates to an apparatus and method for electrical contact testing of substrates such as flat panel displays and semiconductor wafers.

SUMMARY OF THE INVENTION

The general purpose of the present invention, which will be described subsequently in greater detail, is to provide a new apparatus and methodology for electrical contact testing of substrates such as flat panel displays or semiconductor wafers.

The invention has many advantages and many novel features that result in a new and accurate method and apparatus for electrical contact testing of substrates which is not anticipated, rendered obvious, suggested, or even implied.

This invention describes,
 a. A method and apparatus for electrical contact testing of substrates.
 b. A precise x-y translation device using linear motors and air bearing stages for holding and moving the flexible test interface unit.
 c. A z translation stage using a wedge mechanism for positioning the flexible test interface in electrical contact to the substrate under test.
 d. A theta direct drive mechanism using harmonic drives for accurate theta positioning of the flexible test interface unit.
 e. An apparatus to hold down substrates under test through vacuum grooves with access to vacuum ports located on the bottom surface of the automated chuck.
 f. An external O.E.M tester which provides electrical signals through the moving flexible test interface unit to test functionality and locate defects inherent in substrates.

The present invention generally comprises a method and apparatus to electrically test substrates via contacts provided through probe card pins. Through this invention a novel, new and economical way to test substrates accurately is presented.

When compared to conventional testing schemes for electrically testing substrates it is very difficult and cost ineffective to move large heavy substrate holding devices while keeping the tester interface fixed and still maintain testing accuracy. Problems such as mechanical vibration and electrical noise will affect accuracy. Furthermore, when the substrate size changes based on requirements a new chuck needs to be designed to accommodate the corresponding substrate size the above said problems will be enhanced.

The outline below, will broadly describe the important features of the invention in order that the detailed description may be better understood, and in order that the present contribution to the art may be better appreciated. The additional features as illustrated earlier will also be described.

In this respect, before explaining one embodiment of the invention in detail, it should be understood that the invention by itself is not limited to the current application. The invention is capable of being practiced and carried out in various ways. Also it should be understood that the terminology employed are for the purpose of description and not regarded as limiting.

The primary function of the invention is to provide a method and apparatus for electrically testing substrates such as flat panel displays and semiconductor wafers.

Another feature is to provide a method and apparatus to accurately position the flexible test interface in the X, Y, Z and theta location using high magnification cameras w.r.t to the substrate bond pad locations.

Another feature of the present invention is to illustrate a new method for accurate high speed testing of substrates using a combination of an O.E.M provided tester and a flexible test interface.

Finally other features of the present invention will become obvious to the reader and it is intended that these features be within the scope of the present invention.

For accomplishing the above said functionality and features, this invention may be embodied in the form illustrated in the accompanying drawings. However it should be understood that the drawings are for illustrative purpose only and may be subject to change.

BRIEF DESCRIPTION OF THE DRAWINGS

Various other features and advantages of the present invention will become more apparent as the invention becomes better understood when considered in conjunction with the accompanying drawings, in which through reference designators the different parts of the system will be clearly indicated.

FIG. 1 shows a schematic functional block diagram showing a preferred method for electrically testing substrates using contact methodology.

DETAILED DESCRIPTION OF THE INVENTION

Turning now descriptively to the drawings, in which the all the figures comprehensively illustrate a complete method and apparatus to electrically test a substrate using contact methodology.

FIG. 1 shows a complete functional schematic block diagram of the preferred electrical test system, which describes the method for electrically testing a substrate using contact method via flex-test interface. The substrate to be tested is mounted on the substrate holding device and held down with vacuum. Software instructions are issued by the O.E.M tester to the system controller to move the flex-test interface to the correct position on the substrate. The flex-test interface is aligned in all the four axis (X, Y, Z and theta) w.r.t to the location of the first contact pad using high magnification cameras. Contact is made via a probe card by translating the Z axis. Once contact integrity is established testing commences with test instructions from an external O.E.M tester. Results of the various tests are then stored in a file located in the hard drive of the system.

Figure 2A:
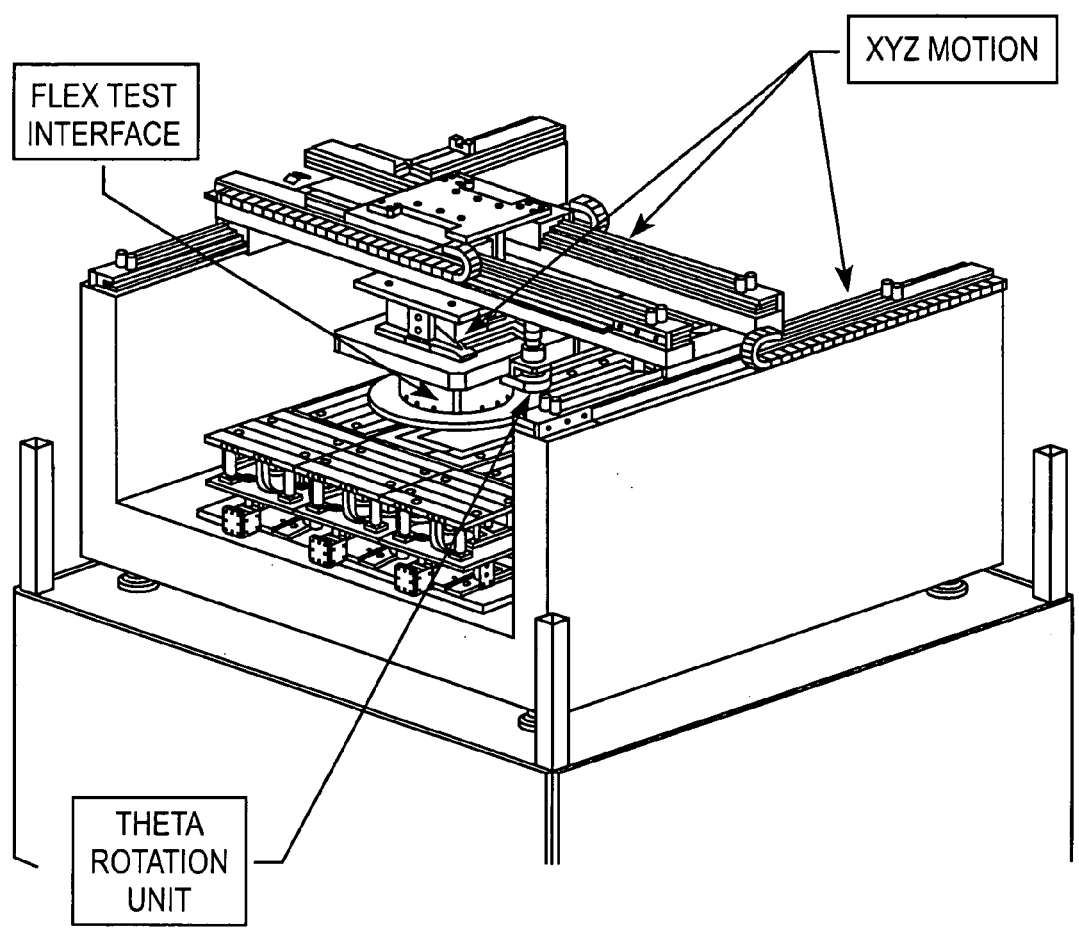
FIG. 2 shows the conceptual mechanical apparatus of the testing platform.

FIG. 2 illustrates that the invention includes mechanical apparatus to hold the substrates. Apparatus to move the flex-test interface in the X, Y, Z and theta directions and Apparatus for automatic alignment using CCD cameras.

Figure 3:
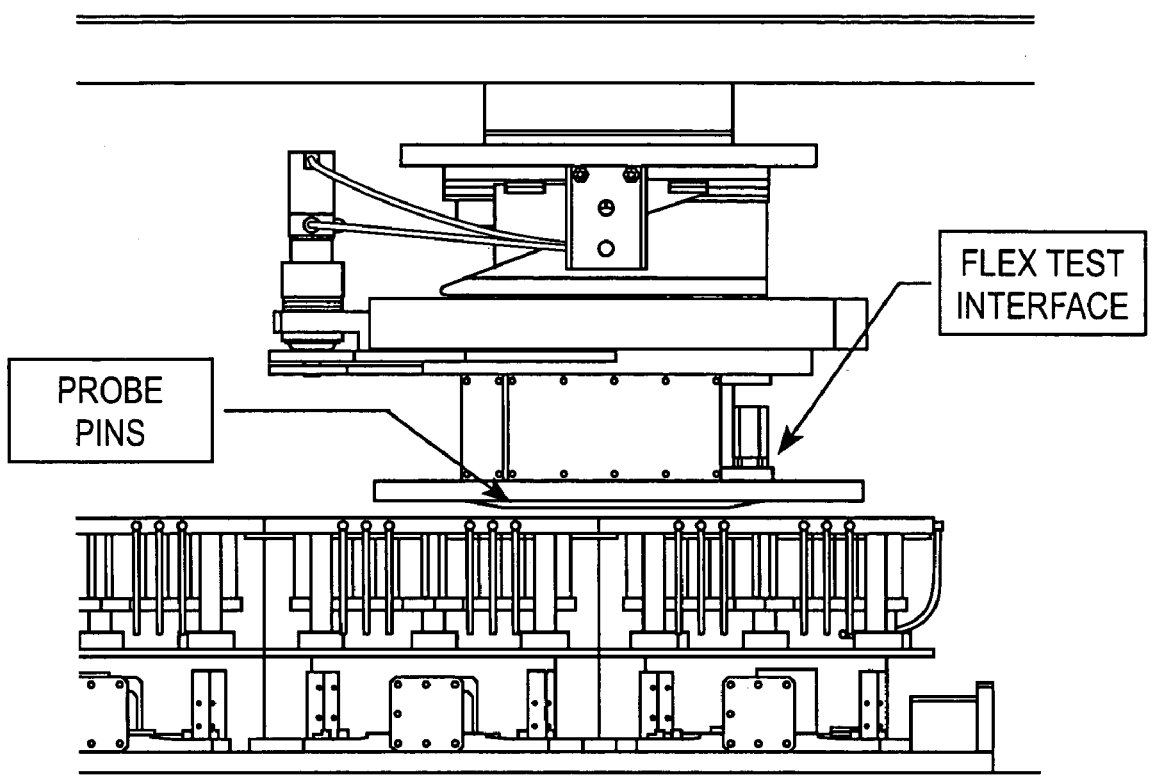
FIG. 3 shows the side view of the system with pointers to critical features necessary to achieve the above stated function of electrical contact testing of substrates.

FIG. 3 primarily shows the side of the test system with pointers to the conceptual flex-test interface along with a probe card with a plurality of measurement pins otherwise known as probe pins used to make contact with the bond pad of the substrate under test.

As to a further discussion of the manner of usage and operation of the present invention, the same should be apparent from above description. Hence, no further discussion relating to the manner of usage and operation will be provided.

With respect to the above description it is to be realized that the optimum relationships for the parts of the invention, to include variations in software, systems, shape, form, function and manner of operation, assembly and use, are deemed readily apparent and obvious to one skilled in the art, and all equivalent relationships to those illustrated in the drawings and described in the specification are intended to be encompassed by the present invention. Therefore, the foregoing is considered as illustrative only of the principles of the invention. Further since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A method for testing with a flexible interface an object having a contact pad, the object being mounted to a holding device, the method comprising:
   identifying a position of the contact pad with a camera or other sensing device;
   translating the flexible interface along a first and a second axis with respect to the position of the contact pad until a first position of the flexible interface is in gross alignment with the position of the contact pad;
   rotating the flexible interface about a third axis with respect to the position of the contact pad until a second position of the flexible interface is in fine alignment with the position of the contact pad, wherein the third axis is different from the first axis and the second axis; and
   testing the object with the flexible interface by contacting the flexible interface with the contact pad and applying an electrical signal through the flexible interface.

2. The method of claim 1, wherein testing the object further comprises;
   fixing the second position of the flexible interface along the first axis and the second axis with respect to the position of the contact pad;
   translating the flexible interface along the third axis with respect to the position of the contact pad until the flexible interface is substantially in electrical contact with the contact pad; and
   applying an electrical signal to the object along the third axis, the electrical signal applied to the object through the flexible interface for performing a test of the object while the flexible interface is in contact with the contact pad.

3. The method of claim 1, wherein translating the flexible interface along the first and second axis comprises independently moving the flexible interface along the first axis and the second axis.

4. The method of claim 1, wherein the first axis is different than the second axis.

5. The method of claim 1, wherein the object is a liquid crystal display.

6. The method of claim 1, wherein the translating step further comprises using linear motors in conjunction with air bearings, electromagnetic or mechanical bearing stages, for translating the flexible interface in precise micro-steps with respect to the position of the contact pad.

7. The method of claim 1, wherein the rotating step further comprises using harmonic drives for fine alignment of the flexible interface with respect to the position of the contact pad.

8. The method of claim 2, wherein the translating step further comprises using a wedge mechanism for positioning the flexible interface in electrical contact with the contact pad.

9. The method of claim 1, wherein the camera is a charge coupled device.

10. The method of claim 1, wherein the holding device comprises vacuum grooves and vacuum ports for holding the object in place.

11. The method of claim 1, wherein the flexible interface comprises a probe card.

12. The method of claim 1, further comprising:
   recording the position of the contact pad, the first position, and the second position in electronic memory, wherein the position of the contact pad, the first position, and second position are defined by a first, second, and third set of coordinates.

13. The method of claim 1, wherein testing further comprises determining a defect present within the object.

14. An apparatus for testing an object having a contact pad, the apparatus comprising:
   a holding device for holding the object in a position;
   a camera for identifying the position of the contact pad of the object, the camera mounted to view the object in the holding device;
   a flexible interface that is moveable along a first and a second axis with respect to the position of the contact pad for gross alignment with the position of the contact pad, and moveable on a third axis with respect to the position of the contact pad for fine alignment with the position of the contact pad, the camera and flexible interface mounted above the holding device.

15. The apparatus of claim 14, wherein the holding device is a substrate holder.

16. The apparatus of claim 14, further comprising a probe card mounted to the flexible interface.

17. The apparatus of claim 14, wherein the flexible interface further comprises a theta rotation unit for moving the flexible interface about the third axis with respect to the position of the contact pad.

18. The apparatus of claim 14, wherein the flexible interface further comprises a XY motion unit for moving the flexible interface along the first and the second axis with respect to the position of the contact pad.

* * * * *